United States Patent [19]
Hull

[11] Patent Number: 5,794,794
[45] Date of Patent: Aug. 18, 1998

[54] MODULAR RACK SYSTEM FOR SUPPORTING ELECTRONIC EQUIPMENT

[76] Inventor: Leslie Hull, 35 Carlson Drive, Newmarket, Ontario, Canada, L3Y 6A8

[21] Appl. No.: 630,740

[22] Filed: Apr. 10, 1996

[51] Int. Cl.$^6$ ...................................................... A47F 5/00
[52] U.S. Cl. .................... 211/26; 211/187; 312/257.1; 361/429
[58] Field of Search ................. 211/13, 26, 134, 211/175, 187, 188; 522/36.1, 126.6; 312/257.1, 350; 361/429

[56] References Cited

U.S. PATENT DOCUMENTS

| | | | |
|---|---|---|---|
| 2,860,404 | 11/1958 | Alden | 312/257.1 |
| 4,605,988 | 8/1986 | Nienhuis et al. | 361/429 |
| 5,499,727 | 3/1996 | Koch | 211/193 |

Primary Examiner—Robert W. Gibson, Jr.
Attorney, Agent, or Firm—Ridout & Maybee

[57] ABSTRACT

A modular rack system is provided for supporting electronic equipment, comprising vertical and lateral frame members cooperating to form a vertical supporting frame, and shelf or rack members supported from a front of the frame for carrying the electronic equipment, wherein the vertical and horizontal frame members comprise channel members with walls defining continuous longitudinal openings at a rear of the frame and cooperating to form a system of interconnected raceways for receiving cables for forming connections to and between the electronic equipment, the walls of the channel shaped members defining ports for passing end connectors of cables. Preferably the channel section members are closed at the rear by doors, and the cable ports are closed by removable cover plates. The horizontal channel section members are located so as to line up with cable ports in the vertical members, while the vertical members may be provided with internal brackets for power bars.

5 Claims, 4 Drawing Sheets

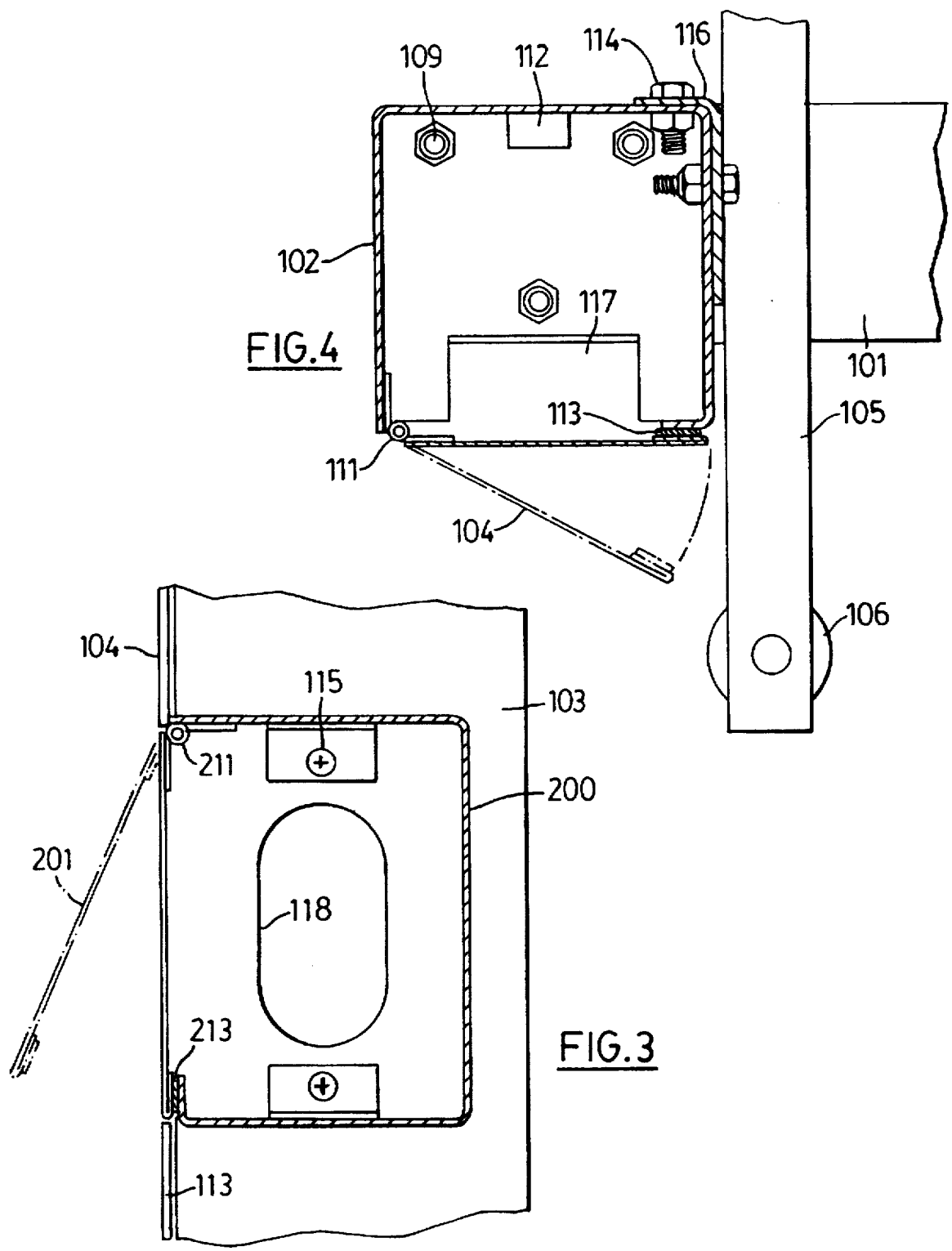

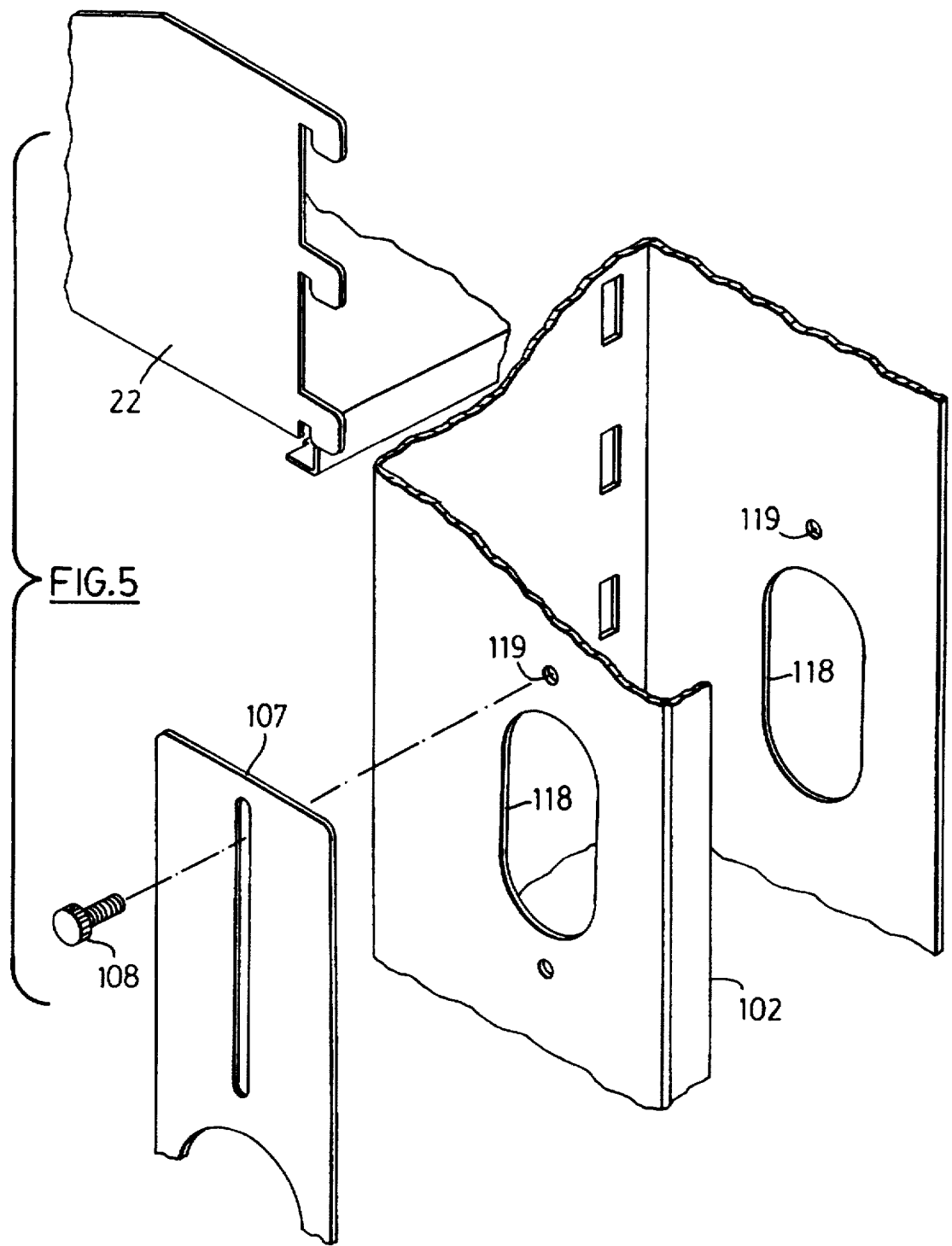

1

MODULAR RACK SYSTEM FOR SUPPORTING ELECTRONIC EQUIPMENT

FIELD OF THE INVENTION

This invention relates to rack systems for supporting computer equipment or other electronic equipment consisting of multiple units requiring electrical supply cable connections and signal or data cable or interconnections. An assembled system may be preferred for convenience as a vertical equipment console.

BACKGROUND OF THE INVENTION

Many systems have been proposed for supporting such equipment and also varying techniques have been adopted for organizing the cable connections and interconnections associated with such equipment.

SUMMARY OF THE INVENTION

An object of the present invention is to provide a modular vertical framing system for a shelf or rack system which combines the functions of supporting a desired array of shelves or racks suited to supporting equipment to be accommodated in a vertical equipment console, while at the same time providing a substantial degree of organization of the associated cables.

The invention provides a modular rack system for supporting electronic equipment, comprising vertical and lateral frame members cooperating to form a vertical supporting frame, and shelf or rack members supported from a front of the frame for carrying the electronic equipment, wherein the vertical and horizontal frame members comprise channel members with walls defining continuous longitudinal openings at a rear of the frame and cooperating to form a system of interconnected raceways for receiving cables for forming connections to and between the electronic equipment, the walls of the channel shaped members defining ports for passing end connectors of cables.

Preferably the channel section members have rear doors to close the raceways, and the ports in the channel sections have removable covers. Vertical channel section members may have brackets for power bars.

SHORT DESCRIPTION OF THE DRAWINGS

In the drawings:

FIG. 3 is a detail section on the line A—A in FIG. 2;

FIG. 4 is a detail section on the line B—B in FIG. 2; and

FIG. 5 is an exploded detail, from the same viewpoint as FIG. 2, of the area indicated by the arrow C in FIG. 1.

DESCRIPTION OF THE PREFERRED EMBODIMENT

Figure 1:
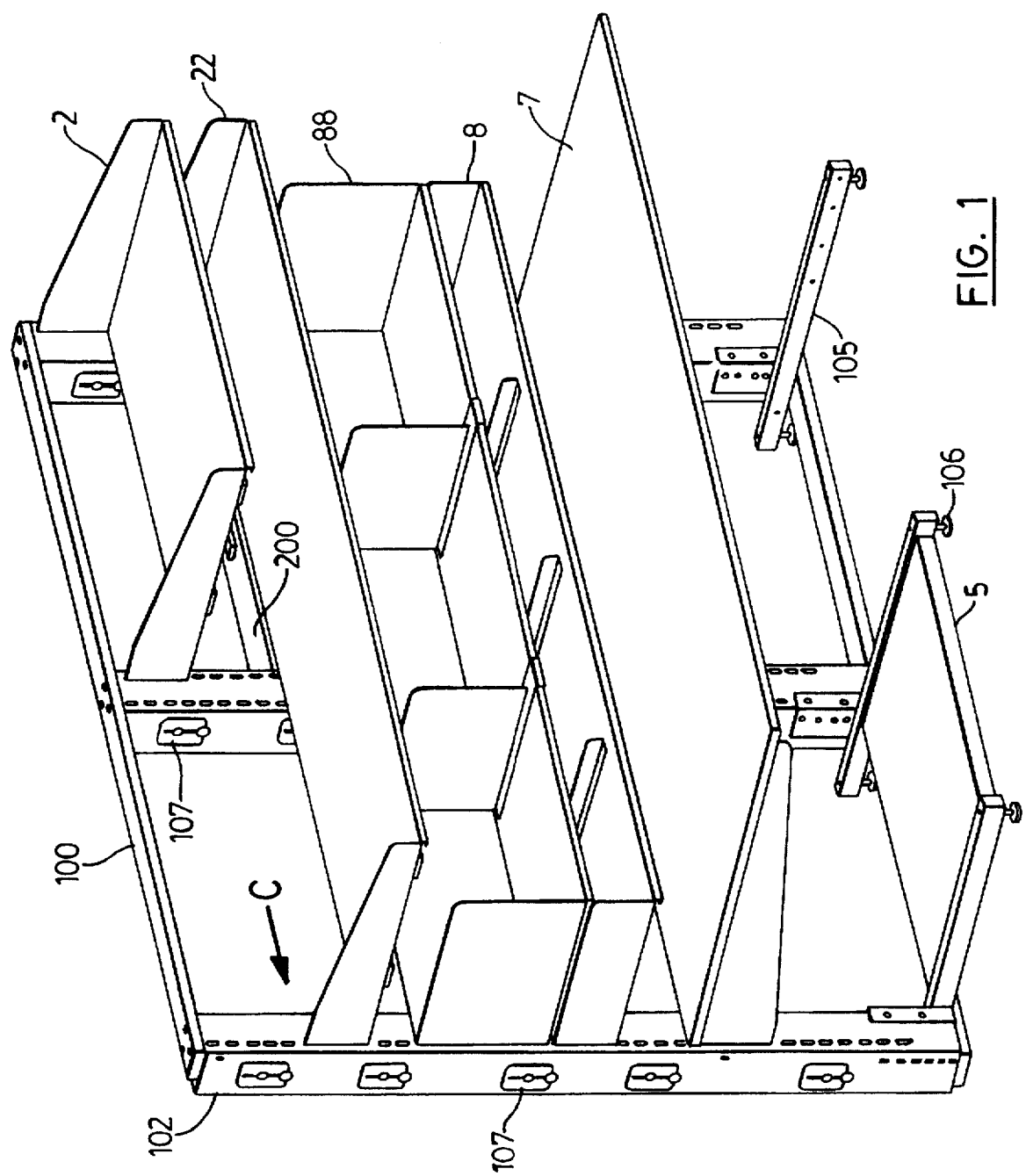
FIG. 1 is an isometric view from above, front and one side of an exemplary system in accordance with the invention, assembled to form a vertical equipment console.
Figure 2:
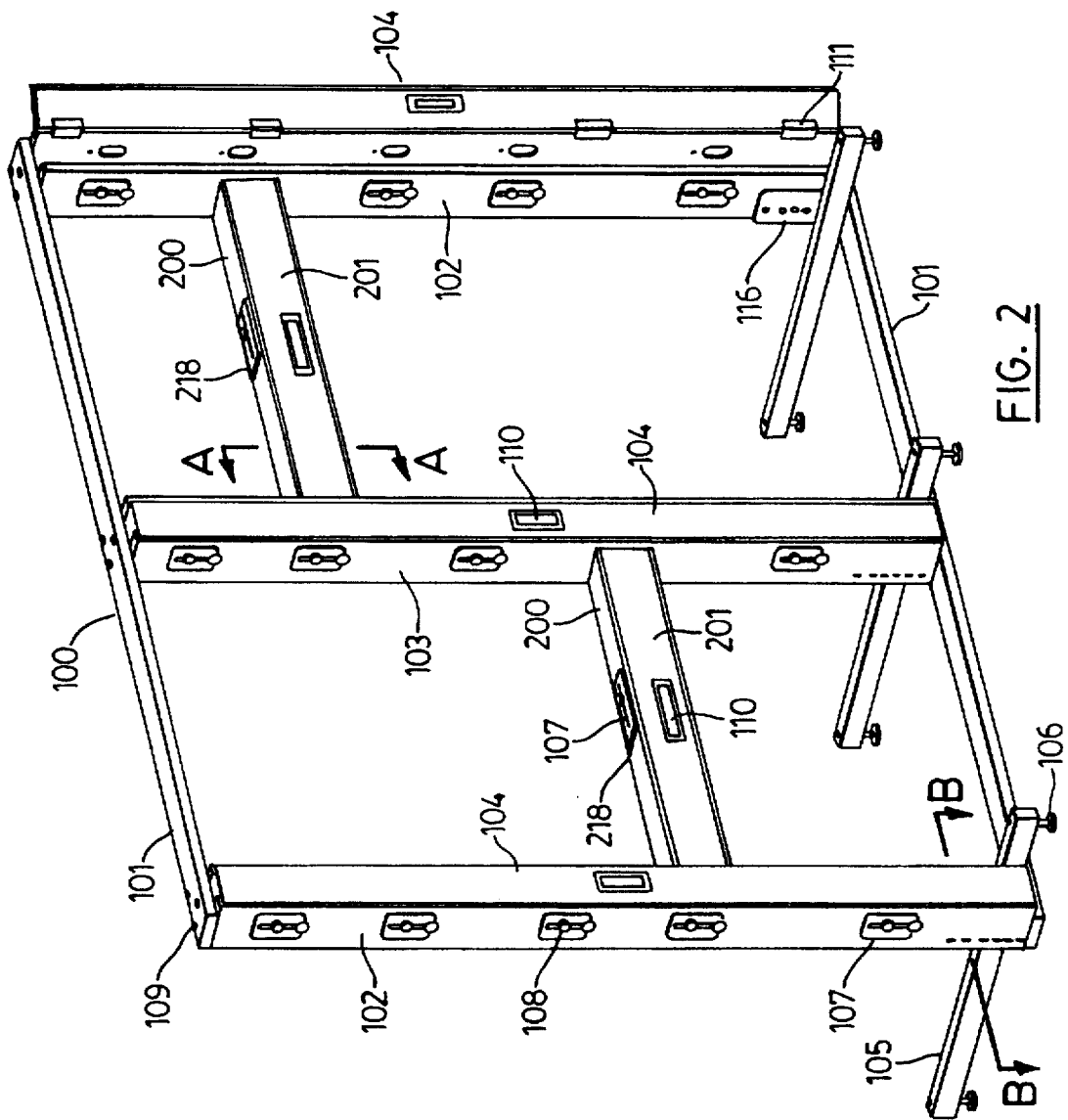
FIG. 2 is an isometric view from above, rear and the other side of a similar system, with the racks and shelves removed.

Referring to the drawings, it will be understood that the assemblies shown are exemplary only, and that the modules of the system to be described may be assembled in many different combinations to form vertical equipment consoles to suit equipment to be housed. It should also be understood that the configurations of the shelf and rack units 2, 7, 8, 22 and 88 shown in the drawings of themselves form no part of

2 the invention: likewise the tongue and slot connections (see FIG. 5) between these parts and the vertical members 102 are conventional in modular shelving systems, and may be replaced by any alternative form of releasable connection means having equivalent functionality. The only requirement of these parts which is essential to the invention is that they can be arranged to provide adequate support, housing and access for the equipment to be supported.

For the purposes of illustrations, the vertical members 102 are shown connected top and bottom by cross members 100, and supported by fore and aft extending legs 105 with feet 106 equipped with conventional levelling screws. Alternative interconnect and support means could be used, provided only that these are not such as to prevent movement of the access doors 104 to be described below, and provide adequate rigidity and support to the structure as a whole.

Referring to FIGS. 3, 4 and 5, the vertical members 102 are of rectangular cross-section, and may typically be roll formed from coated strip seel of adequate gauge to provide desired strength to the structure, with an opening to the rear normally closed by a vertically extending access door 104 connected to the member 2 by a vertical hinge or hinges 111, the door having a handle 110 and normally being retained in a closed position by a magnetic strip 113 attached to either the upright or to the door as shown. Top and bottom walls 115 of he vertical members are secured to the cross-members 101 by bolts 109, while the legs 105 are secured to the vertical members by brackets 116 and bolts 114. The bottom walls 115 are cut away at 117 adjacent the door 104 to provide clearance for cables to enter the interior top vertical column. Attached at vertical intervals to the front inside wall of the column are brackets 112 for the attachment or suspension of power bars or other assemblies providing electrical outlets. The side walls 103 of the column 102 are each formed with a number of vertically spaced apertures 118, large enough to pass plugs and cable connectors of types typically used with computer or other equipment to be supported by the assembly. Apertures about 2–5 cm. by 5 cm with rounded ends will usually be adequate. These apertures are normally closed by removable closure plates secured by thumbscrews 108 engaging threaded bores 119 in the column adjacent the aperture.

At appropriate locations, having regard to the positioning of equipment on the assembly, additional cross-members 200 of rectangular section is provided, also formed with an opening to its rear normally closed by a door 201 connected by a horizontal hinge or hinges 211. This door also is normally retained closed by a magnetic strip 213. The member 200 is secured to the vertical members 102 by screws 115 engaging bores 119 after removal of the associated plates 117.

An aperture or apertures 218 similar to the apertures 118 is formed in at least one of the upper and lower walls of each cross-member 200, and closed when not in use by a cover 107 secured by a thumbscrew.

In use, the system is assembled so as to provide a support frame for shelves and racks such as the work surface 7, the shelves 2 and 22, the paper tray 8, and the book tray rack 88. The legs 105 may support a roll-out shelf 5. Where shelves or work surfaces are to support electronic equipment, cross members 200 are provided, secured as surface provided by shelf unit 7, the shelf units 2 and 22, the paper tray rack 8, and the The various shelves or racks are secured to the support frame, in this example by engaging tabs on their rear vertical edges in slots in the upright members 102, using an arrangement well known in itself. Other attachment systems may be substituted if desired within the scope of the invention.

Opening the doors 104 and 201 exposes at the rear of the frame a system of runways which may be used to route power cords and connecting cables associated with equipment placed on the shelves or racks. Power cords from equipment may be routed through apertures 118 or 218 to reach the equipment. It may be convenient to secure a power bar to a bracket 112 within one or more of the uprights 102 into which such cords may be plugged with the cable from such a cord routed through the cutaway 117 to a convenient outlet. Likewise network or telephone cables may be routed through the cutaways 117 and up the uprights 102 to reach openings 118 or 218, while cables interconnecting equipment may also be routed through the members 102 and 200 between openings 118 or 218. Once all required cables have been routed, the doors may be closed.

In the embodiment shown, the legs 105 project somewhat to the rear of the frame, thus ensuring that sufficient space will be left between the upright frame and an adjacent wall to permit access to the doors 104 and 201 if it is necessary to add, remove or reroute cables.

I claim:

1. A modular rack system for supporting electronic equipment, comprising vertical and lateral frame members cooperating to form a vertical supporting frame, and shelf or rack members supported from the frame for carrying the electronic equipment, wherein the vertical and horizontal frame members respectively comprise vertical and horizontal channel section members with walls defining continuous longitudinal openings at a rear of the frame and cooperating to form a system of interconnected raceways for receiving cables for forming connections to and between the electronic equipment, the walls of the channel section members defining ports for passing end connectors of cables, the ports defined in the vertical channel section members including a plurality of vertical spaced ports in the walls of said members, and the raceways formed by the horizontal members communicating with raceways formed by the vertical members through selected ones of said vertically spaced ports.

2. A system according to claim 1, wherein the channel section members have doors hinged thereto for closing said longitudinal openings.

3. A system according to claim 1, further including removable closing plates normally closing said ports defined in the channel section members.

4. A system according to claim 1, wherein the horizontal channel section members are located to extend between side walls of vertical channel section members and said series of vertically spaced ports are formed in said side walls such that ports in the side walls of vertical channel section members open into the horizontal channel section members.

5. A system according to claim 1, wherein the vertical channel section members comprise internal brackets for the attachment of power bars.

* * * * *